(12) United States Patent
Okumura

(10) Patent No.: US 9,673,062 B1
(45) Date of Patent: Jun. 6, 2017

(54) PLASMA PROCESSING METHOD

(71) Applicant: Panasonic Intellectual Property Management Co., Ltd., Osaka (JP)

(72) Inventor: Tomohiro Okumura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/454,235

(22) Filed: Mar. 9, 2017

Related U.S. Application Data

(62) Division of application No. 14/340,568, filed on Jul. 25, 2014, now Pat. No. 9,627,183.

(30) Foreign Application Priority Data

Oct. 30, 2013 (JP) .................................. 2013-224940
May 12, 2014 (JP) .................................. 2014-098348

(51) Int. Cl.
*H01L 21/00* (2006.01)
*H01L 21/324* (2006.01)
*H01J 37/32* (2006.01)
*H01L 21/02* (2006.01)

(52) U.S. Cl.
CPC ........ *H01L 21/324* (2013.01); *H01J 37/3211* (2013.01); *H01J 37/3244* (2013.01); *H01J 37/32733* (2013.01); *H01L 21/02667* (2013.01)

(58) Field of Classification Search
CPC .............. H01L 21/324; H01L 37/3244; H01L 37/3211; H01L 37/32733; H01L 21/02667
See application file for complete search history.

(56) References Cited

U.S. PATENT DOCUMENTS 5,525,159 A 6/1996 Hama et al.
5,792,261 A 8/1998 Hama et al.
(Continued)

FOREIGN PATENT DOCUMENTS

JP 07-312348 11/1995
JP 10-130851 5/1998
(Continued)

OTHER PUBLICATIONS

"Elongated Inductively Coupled Thermal Plasma Torch Operable at Atmospheric Pressure", Tomohiro Okumura and Hiroshi Kawaura, Jpn. J.Appl. Phys. 52(2013)05EE01.

*Primary Examiner* — Richard Booth
(74) *Attorney, Agent, or Firm* — Panasonic IP Management; Kerry S. Culpepper

(57) ABSTRACT

To provide a plasma processing device, a plasma processing method and a method of manufacturing electronic devices capable of performing high-speed processing as well as using the plasma stably. In an inductively-coupled plasma torch unit, a coil, a first ceramic block and a second ceramic block are arranged in parallel, and a long chamber has an annular shape. Plasma generated in the chamber is ejected from an opening in the chamber toward a substrate. The substrate is processed by moving the long chamber and the substrate mounting table relatively in a direction perpendicular to a longitudinal direction of the opening. A discharge suppression gas is introduced into a space between the inductively-coupled plasma torch unit and the substrate inside the chamber through a discharge suppression gas supply hole, thereby generating long plasma stably.

2 Claims, 5 Drawing Sheets

(56) References Cited

U.S. PATENT DOCUMENTS

| | | | |
|---|---|---|---|
| 5,989,929 A | 11/1999 | Nikoh | H01J 37/321 156/345.24 |
| 6,087,778 A | 7/2000 | Benjamin et al. | |
| 6,267,074 B1 | 7/2001 | Okumura | |
| 2007/0221623 A1 | 9/2007 | Horiguchi et al. | |
| 2010/0062603 A1 | 3/2010 | Ganguly et al. | |
| 2011/0061810 A1 | 3/2011 | Ganguly et al. | |
| 2011/0061812 A1 | 3/2011 | Ganguly et al. | |
| 2011/0065276 A1 | 3/2011 | Ganguly et al. | |
| 2013/0105460 A1 | 5/2013 | Okumura et al. | |
| 2013/0115780 A1 | 5/2013 | Okumura et al. | 438/710 |
| 2013/0230990 A1 | 9/2013 | Okumura et al. | |
| 2013/0309416 A1 | 11/2013 | Yokoyama et al. | |
| 2014/0220784 A1 | 8/2014 | Okumura et al. | |

FOREIGN PATENT DOCUMENTS

| | | |
|---|---|---|
| JP | 10-294307 | 11/1998 |
| JP | 2001-093871 | 4/2001 |
| JP | 2001-259412 | 9/2001 |
| JP | 2004-031621 | 1/2004 |
| JP | 2005-307310 | 11/2005 |
| JP | 2010-129198 | 6/2010 |
| JP | 2013-020836 | 1/2013 |
| JP | 2013-093264 | 5/2013 |
| JP | 2013-120633 | 6/2013 |
| JP | 2013-120684 | 6/2013 |
| JP | 2013-120685 | 6/2013 |
| JP | 2013-522884 | 6/2013 |
| JP | 2013-211244 | 10/2013 |
| WO | 2012/101891 | 8/2012 |

PLASMA PROCESSING METHOD

BACKGROUND OF THE INVENTION

1. Field of the Invention

The present invention relates to a plasma processing device, a plasma processing method and a method of manufacturing electronic devices used for thermal plasma processing which processes a substrate by irradiating the substrate with thermal plasma, a low-temperature plasma processing which processes the substrate by irradiating the substrate with plasma by a reactive gas or with plasma and a reactive gas flow at the same time and other processing.

2. Description of Related Art

A semiconductor thin film such as polycrystalline silicon (poly-Si) is widely used for a thin-film transistor (TFT) and a solar cell in related art. As a method of forming the semiconductor thin film inexpensively, there is a method of irradiating an amorphous silicon film with laser light to crystallize the film. The laser process can be also applied to activation of impurity atoms implanted into a semiconductor substrate by ion implantation or plasma doping. However, the crystallization technique using laser has problems such as occurence of a seam, and further, extremely expensive equipment is necessary.

Accordingly, there has been studied a technique of performing heat treatment without a seam inexpensively by generating long thermal plasma and performing scanning only in one direction (for example, refer to JP-A-2013-120633 (Patent Document 1), JP-A-2013-120684 (Patent Document 2) and JP-A-2013-120685 (Patent Document 3) as well as T. Okumura and H. Kawaura, Jpn. J. Appl. Phys. 52 (2013) 05EE01 (Non-patent document 1)).

SUMMARY OF THE INVENTION

However, for the purposes of performing high-temperature processing to the vicinity of a surface of a substrate for a very short period of time such as in crystallization of semiconductor, there is a problem that processing speed (the number of substrates which can be processed per a unit time) is low in the technique of generating thermal plasma to be long as disclosed in Patent Documents 1 to 3 and Non-Patent Document 1 shown as related-art examples. There is another problem that use efficiency of the gas and high-frequency power is low as the long thermal plasma is far from the substrate, or the substrate is irradiated directly by only one of the two long straight line portions included in the related-art device.

The present invention has been made in view of the above problems, and an object thereof is to provide a plasma processing device, a plasma processing method and a method of manufacturing electronic devices capable of performing processing at high speed as well as capable of stably using plasma when performing high-temperature heat treatment uniformly to the vicinity of the surface of the substrate for a very short period of time, or when performing low-temperature plasma processing to the substrate by irradiating the substrate with plasma by a reactive gas or with plasma and a reactive gas flow at the same time.

According to an embodiment of the present invention, there is provided a plasma processing device including a long annular chamber surrounded by a first dielectric member, an opening communicated to the chamber, a first gas supply pipe for introducing a first gas into the chamber, a coil provided in the vicinity of the chamber, a high frequency power source connected to the coil and a substrate mounting table, in which the chamber is provided along a surface parallel to a surface formed by the substrate mounting table, and a second gas supply pipe for introducing a second gas is provided inside the chamber.

Due to the above structure, high speed processing can be performed as well as plasma can be stably used.

Also according to the embodiment of the present invention, there is provided a plasma processing method ejecting a first gas toward a substrate from an opening communicated to a chamber while supplying the first gas into the long annular chamber surrounded by a first dielectric member as well as generating plasma in the chamber by supplying high-frequency power to a coil, which includes the step of processing the substrate by arranging the chamber along a surface parallel to a surface formed by a substrate mounting table while supplying a second gas inside the chamber.

Due to the above structure, high speed processing can be performed as well as plasma can be stably used.

Also according to the embodiment of the present invention, there is provided a method of manufacturing electronic devices ejecting a first gas toward a substrate from an opening communicated to a chamber while supplying the first gas into a long annular chamber surrounded by a first dielectric member as well as generating a high-frequency electromagnetic field in the chamber by supplying high-frequency power to a coil to thereby generate plasma to process a surface of the substrate. The method particularly includes the step of processing the substrate by arranging the chamber along a surface parallel to a surface formed by a substrate mounting table while supplying a second gas inside the chamber.

Due to the above structure, high speed processing can be performed as well as plasma can be stably used.

According to the embodiments of the present invention, high speed processing can be performed as well as plasma can be stably used when performing high-temperature heat treatment uniformly to the vicinity of the surface of the substrate for a very short period of time, or when performing plasma processing to the substrate by irradiating the substrate with plasma by the reactive gas or with plasma and the reactive gas flow at the same time.

DESCRIPTION OF PREFERRED EMBODIMENTS

Hereinafter, a plasma processing device according to embodiments of the present invention will be explained with reference to the drawings.
(Embodiment 1)

Embodiment 1 of the present invention will be explained below with reference to FIG. 1, FIGS. 2A and 2B.

Figure 1:
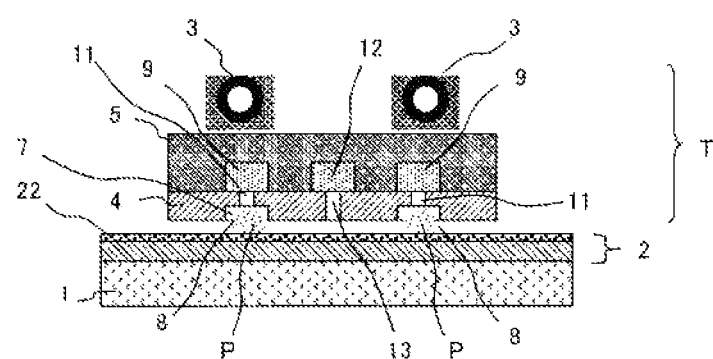
FIG. 1 is a cross-sectional view showing a structure of a plasma processing device according to Embodiment 1 of the present invention.

FIG. 1 shows a structure of a plasma processing device according to Embodiment 1 of the present invention, which is a cross-sectional view taken along a surface perpendicular to a longitudinal direction of a long inductively-coupled plasma torch unit. FIGS. 2A and 2B are assembly structure views of the inductively-coupled plasma torch unit shown in FIG. 1, in which perspective views of respective parts (portions) are aligned. FIG. 2A is a view seen from an upper oblique direction of FIG. 1, and FIG. 2B is a view seen from a lower oblique direction of FIG. 1.

In FIG. 1, a substrate 2 is mounted on a substrate mounting table 1. In an inductively-coupled plasma torch unit T, a coil 3 made of a conductor is disposed in the vicinity of a first ceramic block 4 and a second ceramic block 5. The coil 3 is bonded to the second ceramic block 5 by a not-shown adhesive. A long chamber 7 is defined by a space surrounded by the first ceramic block 4 and the substrate 2.

The coil 3 and the chamber 7 are disposed along a surface parallel to a surface formed by the substrate mounting table 1. An inner wall surface of the chamber 7 in a side closer to the coil 3 is a surface parallel to the coil 3. In such structure, distances between the coil 3 and the chamber 7 are equivalent in arbitrary portions of the coil 3, therefore, inductively-coupled plasma can be generated with small high-frequency power, and efficient plasma generation can be realized.

the inductively-coupled plasma torch unit T is surrounded by a sealing member (not shown) made of a conductor which is entirely grounded, capable of effectively preventing leakage of high frequency (noise) as well as effectively preventing undesirable abnormal discharge.

The chamber 7 is surrounded by an annular groove continuously formed in the first ceramic block 4. That is, the entire chamber 7 is surrounded by a dielectric. The chamber 7 has an annular shape. The annular shape means, in this case, a closed continuous string shape, and is not limited to a rectangular shape as shown in FIG. 2B. In the present embodiment, the chamber 7 having a race-track shape (closed continuous string shape in which straight line portions forming two long sides and straight lines forming two short sides are connected to both ends) is shown as an example. Plasma P generated in the chamber 7 is ejected from a plasma ejection port as an opening 8 in the chamber 7 toward the substrate 2. The longitudinal direction of the chamber 7 is disposed in parallel to the longitudinal direction of the opening 8 as the plasma ejection port.

A rectangular groove provided in the second ceramic block 5 is a plasma gas manifold 9. A porous ceramic material is fitted thereinto. The gas supplied from a plasma gas supply pipe 10 to the plasma gas manifold 9 is introduced to the chamber 7 through plasma gas supply holes 11 (through holes) as a gas introducing portion provided in the first ceramic block 4. According to the structure, the gas flow which is uniform in the longitudinal direction can be easily realized. A flow amount of gas to be introduced to the plasma gas supply pipe 10 is controlled by providing a flow controller such as a mass-flow controller in the upstream. As the porous ceramic material is used in the plasma manifold 9, the uniform gas flow can be realized as well as abnormal discharge in the vicinity of the plasma gas manifold 9 can be prevented.

The plasma gas supply holes 11 are constructed by forming plural round holes in the longitudinal direction, or may be constructed by forming a long slit-shaped hole in the longitudinal direction.

A line-shaped groove provided in the second ceramic block 5 is a discharge suppression gas manifold 12. A porous ceramic material is fitted thereinto. The gas supplied from a discharge suppression gas supply pipe 14 is introduced into a space between the inductively-coupled plasma torch unit T and the substrate 2 inside the chamber 7 through a discharge suppression gas supply hole 13 (through hole) as a gas introducing portion provided in the first ceramic block 4.

The discharge suppression gas supply hole 13 is constructed by forming plural round holes in the longitudinal direction, or may be constructed by forming a long slit-shaped hole in the longitudinal direction.

It is also preferable to arrange a shielding gas nozzle as a shielding gas supply port in a position close to the substrate mounting table 1, though not shown. The shielding gas is supplied in addition to the plasma gas suitable for generating plasma, thereby reducing the mixture of gas which is not necessary for processing or adversely affects the processing such as oxygen and carbon dioxide in the air to a plasma irradiation surface. The shielding gas supply port may be a slit having a shape elongated in a direction parallel to the longitudinal direction of the opening 8, or may be many holes aligned in the direction parallel to the longitudinal direction of the opening 8.

The coil 3 is formed by bonding a copper pipe having a circular shape in cross section to a copper block having a rectangular parallelepiped shape in cross section. The coil 3 is a hollow tube, and the inside of the tube is a flow path for refrigerant. That is, cooling can be performed by allowing the refrigerant such as water to flow. It is also preferable to provide refrigerant flow paths so as to be in parallel to the longitudinal direction of the opening 8 in the first ceramic block 4 the second ceramic block 5. Also, the first ceramic block 4 and the second ceramic block 5 as well as the second ceramic block 5 and the coil 3 are respectively bonded by using an adhesive, thereby cooling the first ceramic block 4 and the second ceramic block 5 through the adhesive. In this case, a cooling portion for cooling the chamber 7 is the coil 3, and the second ceramic block 5 having a higher heat conductivity than the first ceramic block 4 is provided between the first ceramic block 4 and the coil 3. That is, the first ceramic block 4 is made of silicon nitride and the second ceramic block 5 is made of aluminum nitride. Due to the structure, the first ceramic block 4 can be cooled more effectively than in a case where the second ceramic block 5 is also made of silicon nitride, therefore, larger high-frequency power can be inputted and higher speed processing can be realized. As excellent heat resistance is required for the first ceramic block 4, ceramic materials mainly containing silicon nitride, or ceramic materials mainly containing silicon, aluminum, oxygen and nitrogen are suitable. On the other hand, as the second ceramic block 5 does not directly contact thermal plasma reaching several thousand degrees to 10,000 degrees, excellent heat conductivity is required more than the heat resistance, therefore, ceramic materials mainly containing aluminum nitride or ceramic materials mainly containing boron nitride are suitable.

Figure 2A:
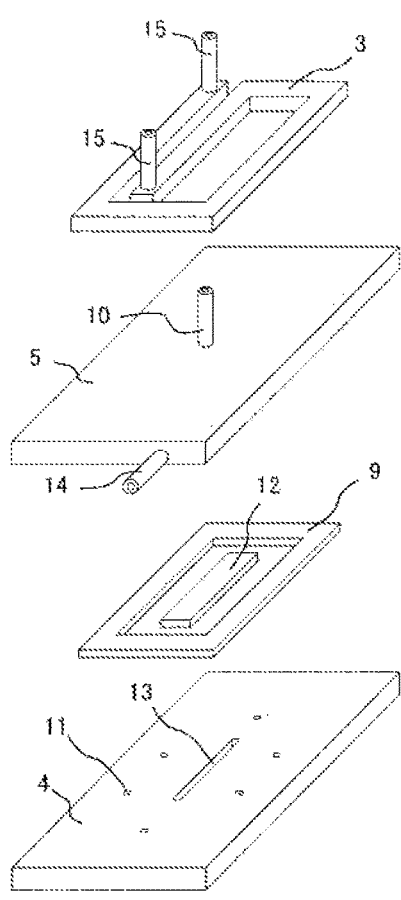
FIGS. 2A and 2B are perspective views showing the structure of a plasma processing device according to Embodiment 1 of the present invention.
Figure 2B:
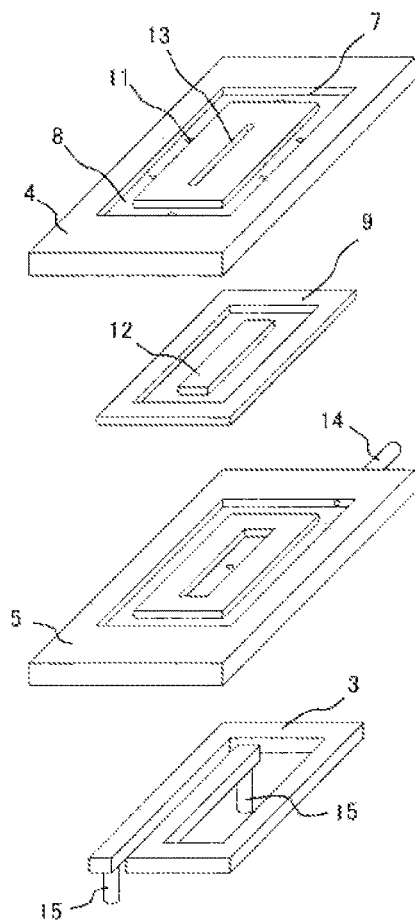

As shown in FIGS. 2A and 2B, the coil 3 has a flat spiral shape forming a rectangular shape as a whole, in which a refrigerant supply and discharge port 15 is provided at an end portion.

The rectangular opening 8 is provided, and the substrate mounting table 1 (or the substrate 2 on the substrate mounting table 1) is arranged opposite to the opening 8. The high frequency power is supplied to the coil 3 from a not-shown high-frequency power source while supplying the plasma gas into the chamber 7 and ejecting the gas from the opening 8 toward the substrate 2 in the above state, thereby generating the plasma P in the chamber 7 and irradiating the substrate 2 with the plasma from the opening 8, as a result, the plasma processing can be performed to the thin film 22 on the substrate 2. The substrate 2 is processed by moving the chamber 7 and the substrate mounting table 1 relatively in a direction perpendicular to the longitudinal direction of the opening 8. That is, the inductively-coupled plasma torch unit T or the substrate mounting table 1 is moved in a right and left direction of FIG. 1.

Various kinds of gases can be used as the plasma gas to be supplied to the chamber 7, but it is desirable to use inert gases, particularly desirable to mainly use noble gases when considering stability and ignition performance of plasma, lifetime of members exposed to plasma and so on. Among them, Ar gas is typically used. When plasma is generated only by the Ar gas, plasma will be a considerably high temperature (10,000K or more).

As a discharge suppression gas to be introduced into the space between the inductively-coupled plasma torch unit T and the substrate 2 inside the chamber 7, a gas mainly containing a gas other than noble gases is preferable. For example, nitrogen, oxygen, carbon dioxide and so on can be used as gases which are relatively safe and low in price. As these gases do not easily become thermal plasma as compared with noble gases, it is possible to suppress a phenomenon in which the annular thermal plasma is connected between two openings 8 positioned at right and left in FIG. 1 in the space between the inductively-coupled plasma torch unit T and the substrate 2 inside the chamber 7 and a small circular plasma is generated instead of the long thermal plasma.

As the Ar gas is particularly suitable for generating thermal plasma in noble gases, it is preferable that the Ar gas is used as a plasma gas and another noble gas is used as a discharge suppression gas. If another gas is mixed several % or more even when using the gas which mainly contains Ar, thermal plasma is not easily generated, therefore, the mixed gas mainly containing Ar or another noble gas but containing a gas other than Ar several % or more may be used as the discharge suppression gas.

In the present structure, the length of the opening 8 in the longitudinal direction is larger then the width of the substrate 2. Therefore, the entire thin film 22 in the vicinity of the surface of the substrate 2 can be processed by one scanning (to relatively move the inductively-coupled plasma torch unit T and the substrate mounting table 1). Due to the structure, the plasma in the short sides of the opening 8 having a rectangular shape as a whole is not irradiated to the substrate, therefore, uniform processing can be performed.

A high frequency power of 13.56 MHz is supplied to the coil 3 from the not-shown high-frequency power source while supplying the Ar gas or an Ar+$H_2$ gas as the plasma gas into the chamber 7 and ejecting the gas from the opening 8 toward the substrate 2 in the above plasma processing device, thereby generating an electromagnetic field in the chamber 7 to generate the plasma P. The substrate 2 is irradiated with the plasma from the opening 8 and scanned, thereby performing heat treatment such as crystallization of a semiconductor film and so on.

As conditions for generating plasma, appropriate values are approximately: the distance between the opening 8 and the substrate 2=0.1 to 5 mm, the scanning speed=°to 3000 mm/s, the total flow of plasma gas=1 to 100 SLM, the $H_2$ density in Ar+$H_2$ gas=0 to 10%, the flow of discharge suppression gas ($N_2$)=1 to 100 SLM, and the high frequency power=0.5 to 10 kW. The gas flow and the power in these values show values per a length 100 mm of the opening 8. It is because, it is suitable that an amount proportional to the length of the opening 8 is inputted concerning parameters such as the gas flow and the power.

As described above, the long chamber 7 and the substrate mounting table 1 are relatively moved in the direction perpendicular to the longitudinal direction of the opening 8 while arranging the longitudinal direction of the opening 8 and the substrate mounting table 1 in parallel to each other, therefore, it is possible to construct the device so that the length of plasma to be generated is substantially equivalent to the length of the substrate 2 to be processed.

As described above, the structure according to the embodiment, the substrate 2 is positioned close to the long thermal plasma as well as the substrate 2 is directly irradiated with plasma by using both sides of two long straight line portions forming the long chamber 7, therefore, use efficiency of the gas and the high frequency power is excellent. That is, high-speed processing can be realized as well as the plasma can stably used at the time of performing high-temperature heat treatment uniformly to the vicinity of the surface of the substrate for a very short period of time, or at the time of performing low-temperature plasma processing to the substrate by irradiating the substrate with plasma by a reactive gas or with plasma and a reactive gas flow at the same time.

(Embodiment 2)

Hereinafter, Embodiment 2 of the present embodiment will be explained with reference to FIG. 3.

Figure 3:
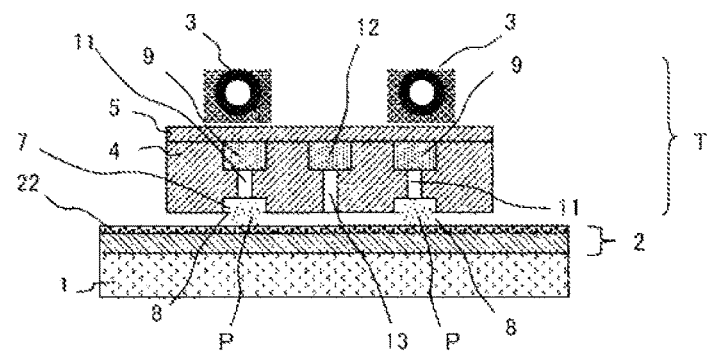
FIG. 3 is a cross-sectional view showing a structure of a plasma processing device according to Embodiment 2 of the present invention.

FIG. 3 shows a structure of a plasma processing device according to Embodiment 2 of the present invention, which is a cross-sectional view taken along a surface perpendicular to the longitudinal direction of the inductively-coupled plasma torch unit and corresponds to FIG. 1.

In Embodiment 2, the first ceramic block 4 and the second ceramic block 5 are formed by the same material (silicon nitride). The plasma gas manifold 9 and the discharge suppression gas manifold 12 are formed by the groove provided in the first ceramic block 4, and the second ceramic block 5 is a simple flat plate.

The above structure has an advantage in which it is sufficient that complicated processing is performed only to the first ceramic block 4 though the cooling ability of the first ceramic block 4 is inferior.

(Embodiment 3)

Hereinafter, Embodiment 3 of the present embodiment will be explained with reference to FIG. 4, FIGS. 5A and 5B.

Figure 4:
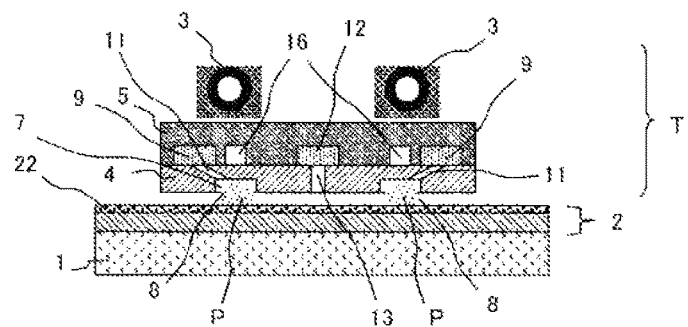
FIG. 4 is a cross sectional view showing a structure of a plasma processing device according to Embodiment 3 of the present invention.

FIG. 4 shows a structure of a plasma processing device according to Embodiment 3 of the present invention, which is a cross-sectional view taken along a surface perpendicular to the longitudinal direction of the inductively-coupled plasma torch unit and corresponds to FIG. 1. FIGS. 5A and 5B are assembly structure views of the inductively-coupled plasma torch unit shown in FIG. 4, in which perspective views of respective parts (portions) are aligned. FIG. 5A is a view seen from an upper oblique direction of FIG. 4 and FIG. 5B is a view seen from a lower oblique direction of FIG. 4.

In FIG. 4, a refrigerant flow path 16 is provided between the coil 3 and the chamber 7 along the chamber 7. The refrigerant flow path 16 is formed by a groove provided in the first ceramic block 4 and the second ceramic block 5 bonded thereto. A refrigerant flowing in the refrigerant flow path 16 is configured to directly contact the first ceramic block 4, which can effectively keep the chamber 7 to be in a low temperature. As the refrigerant flow path 16 is arranged so as to be extend along the chamber 7 for giving priority to maximization of cooling efficiency, the plasma gas manifold 9 for storing the plasma gas is arranged in the outside of the refrigerant flow path 16, and the plasma gas supply holes 11 are provided in an inclined manner. That is, the direction in which the gas flows in the plasma gas supply holes 11 are inclined with respect to the flat surface formed by the chamber 7.

Figure 5A:
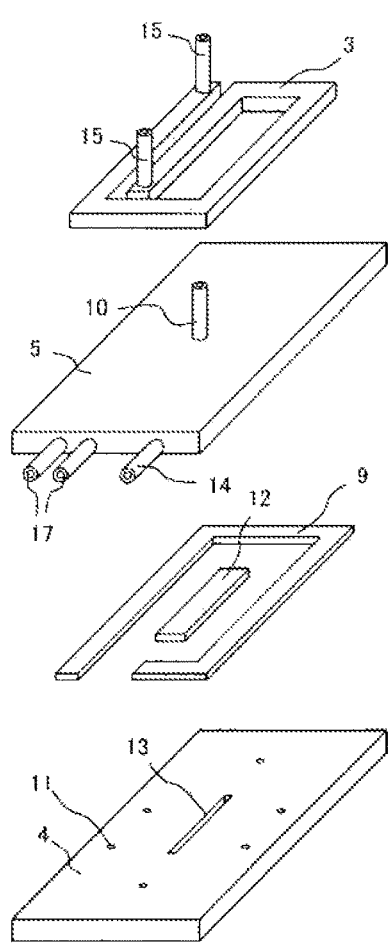
FIGS. 5A and 5B are perspective views showing the structure of the plasma processing device according to Embodiment 3 of the present invention.
Figure 5B:
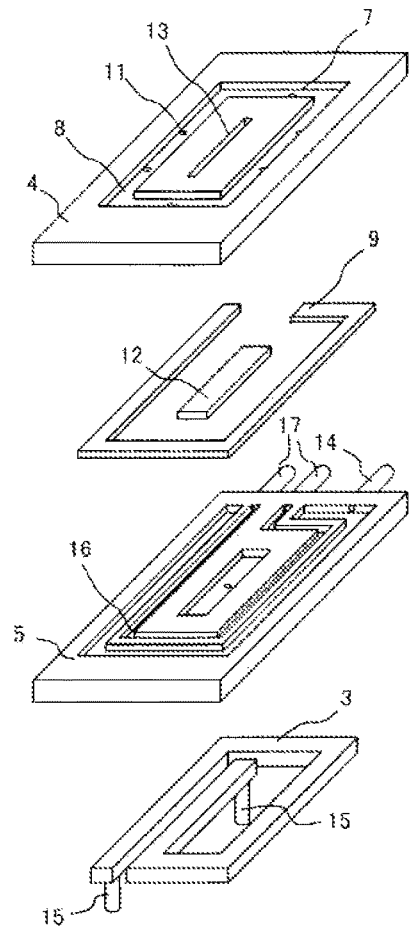

As shown in FIGS. 5A and 5B, supply and discharge of, for example, cooling water flowing in the refrigerant flow path 16 are performed by a supply and discharge pipe 17. In the present embodiment, two grooves are formed in the second ceramic block 5 so that the refrigerant flow path 16 does not interfere with the plasma gas manifold 9.

(Embodiment 4)

Hereinafter, Embodiment 4 of the present embodiment will be explained with reference to FIG. 6, FIGS. 7A and 7B.

Figure 6:
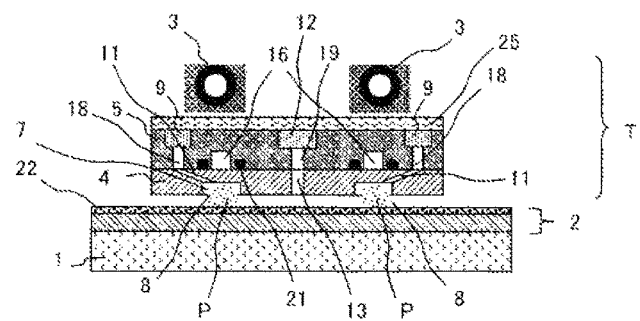
FIG. 6 is a cross-sectional view showing a structure of a plasma processing device according to Embodiment 4 of the present invention.

FIG. 6 shows a structure of a plasma processing device according to Embodiment 4 of the present invention, which is a cross-sectional view taken along a surface perpendicular to the longitudinal direction of the inductively-coupled plasma torch unit and corresponds to FIG. 1. FIGS. 7A and 7B are assembly structure views of the inductively-coupled plasma torch unit shown in FIG. 6, in which perspective views of respective parts (portions) are aligned. FIG. 7A is a view seen from an upper oblique direction of FIG. 6 and FIG. 7B is a view seen from a lower oblique direction of FIG. 6.

Figure 7A:
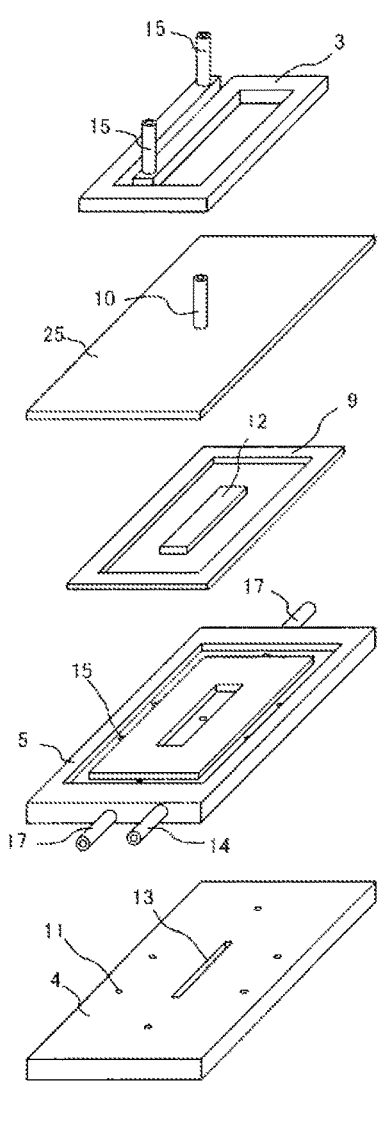
FIGS. 7A and 7B are perspective views showing the structure of the plasma processing device according to Embodiment 4 of the present invention.
Figure 7B:
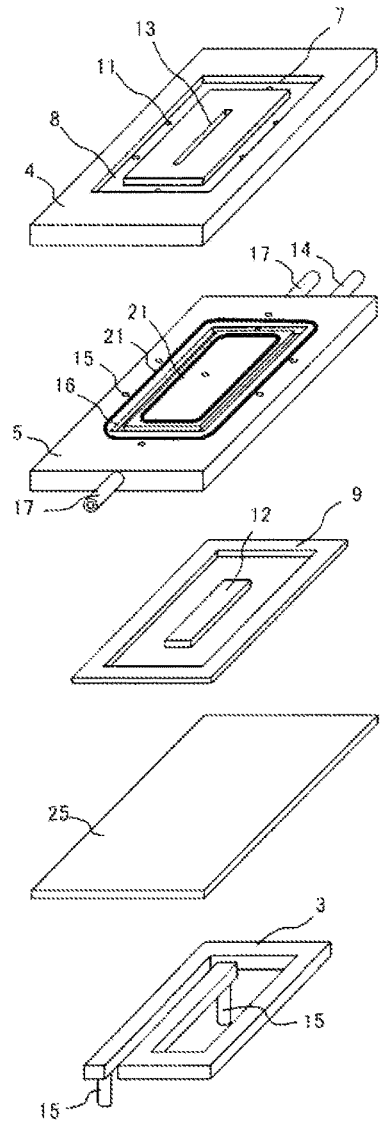

The present embodiment differs from Embodiment 3 in a point that the refrigerant flow path 16 is provided on a lower surface (surface facing the substrate mounting table 1) of the second ceramic block 5, and the plasma gas manifold 9 and the discharge suppression gas manifold 12 are provided on the opposite surface, namely, an upper surface of the second ceramic block (surface not facing the substrate mounting table 1) in FIG. 6, FIG. 7A and FIG. 7B. The refrigerant flow path 16 is formed by a groove provided in the second ceramic block 5 and the first ceramic block 4 bonded thereto. The plasma gas manifolds 9 and the discharge suppression gas manifold 12 are formed by a groove provided in the second ceramic block 5 and a ceramic plate 25 bonded thereto.

The plasma gas manifold 9 and the plasma gas supply holes 11 are connected by pipes 18 formed by through holes communicated to the plasma gas manifold 9 made of the porous ceramic material fitted to the groove provided in the second ceramic block 5. Similarly, the discharge suppression gas manifold 12 and the discharge suppression gas supply hole 13 are connected by a pipe 19 formed by a through hole communicated to the discharge suppression gas manifold 12 made of the porous ceramic material fitted to the groove provided in the second ceramic block 5.

In the above Embodiment 3, the first ceramic block 4 and the second ceramic block 5 are connected by the adhesive to prevent the leakage of the refrigerant from the refrigerant flow path 16. In the present embodiment, the refrigerant flow 16 is sealed by an O-ring 21. The refrigerant flow path 16, the plasma gas manifold 9 and the discharge suppression gas manifold 12 are formed by the groove provided on another surface of the second ceramic block 5, thereby forming the refrigerant flow path 16 in a simple annular shape as shown in FIG. 7B, as a result, a structure in which the sealing by the O-ring 21 is easily performed can be obtained.

Though the first ceramic block 4 and the second ceramic block 5 may be bonded to each other, it is also preferable that they are not bonded but fastened to each other by a not-shown bolt/nut and so on. Accordingly, there is an advantage that maintenance such as disassembly and cleaning can be performed.

(Embodiment 5)

Hereinafter, Embodiment 5 of the present embodiment will be explained with reference to FIG. 8.

Figure 8:
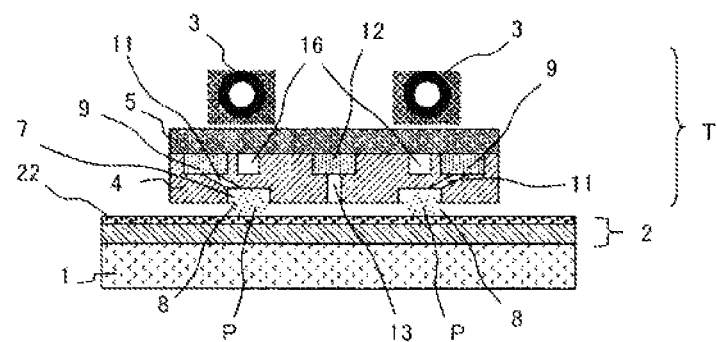
FIG. 8 is a cross-sectional view showing a structure of a plasma processing device according to Embodiment 5 of the present invention.

FIG. 8 shows a structure of a plasma processing device according to Embodiment 5 of the present invention, which is a cross-sectional view taken along a surface perpendicular to the longitudinal direction of the inductively-coupled plasma torch unit and corresponds to FIG. 1.

The present embodiment differs from Embodiment 3 in a point that the refrigerant flow path 16 and the plasma gas manifold 9 are provided on an upper surface of the first ceramic block 4 (surface not facing the substrate mounting table 1) in FIG. 8. Such structure can be also applied.

(Embodiment 6)

Hereinafter, Embodiment 6 of the present embodiment will be explained with reference to FIG. 9.

Figure 9:
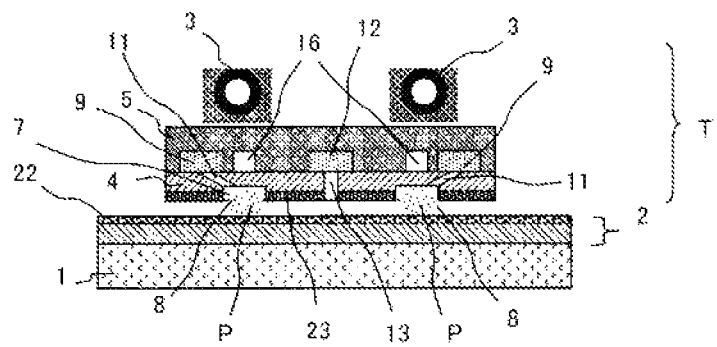
FIG. 9 is a cross-sectional view of a structure of a plasma processing device according to Embodiment 6 of the present invention.

FIG. 9 shows a structure of a plasma processing device according to Embodiment 6 of the present invention, which is a cross-sectional view taken along a surface perpendicular to the longitudinal direction of the inductively-coupled plasma torch unit and corresponds to FIG. 1.

The present embodiment differs from Embodiment 3 in a point that a shielding plate 23 made of silicon is provided on a lower surface of the first ceramic block 4 (surface facing the substrate mounting table 1) in FIG. 9. Due to the structure, as the high-frequency electromagnetic field generated by the coil 3 is effectively shielded by the shielding plate 23, the high-frequency electromagnetic field in the vicinity of the substrate 2 is considerably reduced, therefore, there is an advantage that breakdown/deterioration of electronic devices such as a transistor formed on the substrate 2 caused by electrostatic damage hardly occur.

(Embodiment 7)

Hereinafter, Embodiment 7 of the present embodiment will be explained with reference to FIG. 10.

Figure 10:
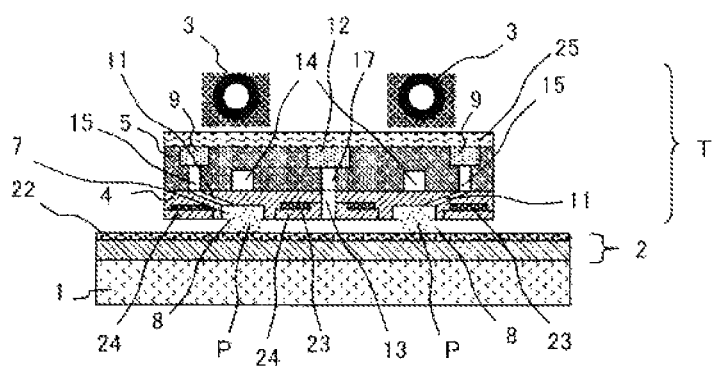
FIG. 10 is a cross-sectional view of a structure of a plasma processing device according to Embodiment 7 of the present invention.

FIG. 10 shows a structure of a plasma processing device according to Embodiment 7 of the present invention, which is a cross-sectional view taken along a surface perpendicular to the longitudinal direction of the inductively-coupled plasma torch unit and corresponds to FIG. 1.

In FIG. 10, the shielding plate 23 made of metal is arranged on a concave portion provided in a lower surface (surface facing the substrate mounting table 1) of the first ceramic block 4, and a shielding plate cover 24 covering the shielding plate 23 is further provided. Due to the structure, there are advantages that electrostatic damage can be suppressed in the same manner as Embodiment 6 and that abnormal discharge such as arc which may occur on the surface of the shielding plate 23 in Embodiment 6 hardly occurs.

The plasma processing devices and the plasma processing methods described above are just typical examples in the application range of the present invention.

For example, the inductively-coupled plasma torch unit T may be scanned with respect to the fixed substrate mounting table 1 as well as the substrate mounting table 1 may be scanned with respect to the fixed inductively-coupled plasma torch unit T.

Various structures of the present invention enable high-temperature processing to the vicinity of the surface of the substrate 2. Accordingly, the present invention can be applied to not only crystallization of a semiconductor film for TFT and quality improvement of a semiconductor film for a solar cell described in related-art examples but also various surface processing such as oxidation and activation of a silicon semiconductor integrated circuit, annealing for forming silicide, clean-up and reduction of degassing of a protective layer of a plasma display panel, surface planarization and reduction of degassing of a dielectric layer made of an aggregation of silica particles, the reflow of various electronic devices, and plasma doping using a solid impurity source. The present invention can be also applied to a method of manufacturing solar cells, in which powder obtained by crushing a silicon ingot is applied on the substrate to be irradiated with plasma and melted to thereby obtain a polycrystalline silicon film.

It is also possible to use an ignition source for facilitating the ignition of plasma. As the ignition source, a sparking apparatus for ignition used for a gas water heater and so on can be applied.

The word, "thermal plasma" is used in the explanation for simplification, however, it is strictly difficult to distinguish between thermal plasma and low-temperature plasma. It is also difficult to distinguish types of plasma only based on the thermal equilibria, for example, as commented in "Non-equilibria of thermal plasma" by TANAKA Yasunori in a journal of plasma and fusion research Vol. 82, NO. 8 (2006) pp. 479-483. An object of the present invention is to perform heat treatment to the substrate, and the present invention can be applied to the technique of irradiating high-temperature plasma regardless of words such as thermal plasma, thermal equilibria plasma and high-temperature plasma.

Though the case where high-temperature heat treatment is performed uniformly to the vicinity of the surface of the substrate for a very short period of time has been explained in detail as an example, the present invention can be also applied to the case where low-temperature plasma processing is performed to the substrate by irradiating the substrate with plasma by the reactive gas or with plasma and the reactive gas flow at the same time. The reactive gas is mixed into the plasma gas, thereby realizing etching and CVD by irradiating the substrate with plasma by the reactive gas.

Alternatively, when a gas including a reactive gas as a shielding gas is supplied while using a noble gas or a gas obtained by adding a small amount of $H_2$ gas to the noble gas as a plasma gas, thereby irradiating the substrate with plasma and the reactive gas flow at the same time and realizing plasma processing such as etching, CVD and doping. When using the gas mainly containing argon as the plasma gas, thermal plasma is generated as explained in the embodiments in detail.

On the other hand, when using a gas mainly containing helium as a plasma gas, relatively low-temperature plasma can be generated. It is possible to perform processing such as etching and film deposition without heating the substrate to a high degree by using the above method. As reactive gases used for etching, there are halogen-containing gases such as CxFy (x and y are natural numbers) and $SF_6$, whereby performing etching of silicon, silicon compounds and the like. When $O_2$ is used as a reactive gas, removal of organic matters, resist ashing and so on can be performed. As reactive gases used for CVD, there are monosilane, disilane and so on, whereby performing depositing of silicon and silicon compounds.

Alternatively, when using a mixed gas of an organic gas containing silicon represented by TEOS (Tetraethoxysilane) and $O_2$, a silicon oxide film can be deposited. Other various low-temperature plasma processing such as surface processing for improving water repellency and hydrophilia can be performed. As the present technique relates to the inductively-coupled type device, the arc discharge does not easily occur even when higher power density per a unit volume is inputted as well as higher density plasma can be generated as compared with the related art technique using capacitive-coupled atmospheric plasma, as a result, higher reaction speed can be obtained and a desired region to be processed in the substrate can be entirely processed efficiently for a short period of time.

As described above, the present invention can be applied to crystallization of the semiconductor film for TFT and quality improvement of the semiconductor film for a solar cell. The present invention is useful, which is capable of performing high-speed processing as well as using plasma stably at the time of performing high-speed heat treatment uniformly to the vicinity of the surface of the substrate for a very short period of time in various surface processing such as clean-up and reduction of degassing of a protective layer of a plasma display panel, surface planarization and reduction of degassing of a dielectric layer made of an aggregation of silica particles, the reflow of various electronic devices, and plasma doping using a solid impurity source.

The present invention is also useful, which is capable of processing an entire desired region to be processed in the substrate for a short period of time efficiently in low-temperature plasma processing such as etching, deposition, doping, surface quality improvement and so on in the manufacture of various electronic devices.

What is claimed is:

1. A plasma processing method ejecting a first gas toward a substrate from an opening communicated to a chamber while supplying the first gas into the long annular chamber surrounded by a first dielectric member as well as generating a high-frequency electromagnetic field in the chamber by supplying high-frequency power to a coil to thereby generate plasma to process a surface of the substrate, the method comprising the step of:

processing the substrate by arranging the chamber along a surface parallel to a surface formed by a substrate mounting table while supplying a second gas inside the chamber, wherein the opening has at least two long straight line portions, and a movement mechanism is provided, which is capable of moving the chamber and the substrate mounting table relatively in a direction perpendicular to a longitudinal direction of the opening, the second gas is provided to the discharge suppression gas supply hole, an the opening and the discharge suppression gas supply hole are formed on the same plane.

2. The plasma processing method according to claim 1,
wherein the first gas is a noble gas, or a gas mainly containing the noble gas, and
the second gas is a gas mainly containing a gas other than the noble gas.

* * * * *